(12) United States Patent
Desineni et al.

(10) Patent No.: US 7,682,842 B2
(45) Date of Patent: Mar. 23, 2010

(54) METHOD OF ADAPTIVELY SELECTING CHIPS FOR REDUCING IN-LINE TESTING IN A SEMICONDUCTOR MANUFACTURING LINE

(75) Inventors: Rao H. Desineni, Poughkeepsie, NY (US); Xu Ouyang, Hopewell Junction, NY (US); Hargurpreet Singh, Poughkeepsie, NY (US); Yunsheng Song, Poughkeepsie, NY (US); Stephen Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 12/129,712

(22) Filed: May 30, 2008

(65) Prior Publication Data

US 2009/0299679 A1 Dec. 3, 2009

(51) Int. Cl.
H01L 21/00 (2006.01)
(52) U.S. Cl. .............................. 438/7; 438/10; 438/16; 438/17
(58) Field of Classification Search ................ 438/5–17
See application file for complete search history.

(56) References Cited

U.S. PATENT DOCUMENTS

| | | | |
|---|---|---|---|
| 6,174,738 B1 * | 1/2001 | Steffan et al. | 438/5 |
| 6,804,570 B2 * | 10/2004 | Kirshenbaum | 700/110 |
| 7,139,672 B2 | 11/2006 | Dorough et al. | |
| 7,162,386 B2 | 1/2007 | Dorough et al. | |
| 7,165,004 B2 | 1/2007 | Dorough et al. | |
| 7,174,521 B2 | 2/2007 | Stine et al. | |
| 7,378,287 B2 * | 5/2008 | Rubinstein et al. | 438/6 |
| 2004/0181717 A1 | 9/2004 | Madge et al. | |
| 2004/0236531 A1 | 11/2004 | Madge | |

OTHER PUBLICATIONS

"Adaptive test adds value to wafer probe" authored by B. Bischoff et al. and published in Semiconductor International Magazine (Aug. 2004) http://www.semiconductor.net/article/CA440790.html.

* cited by examiner

Primary Examiner—Richard A. Booth
(74) Attorney, Agent, or Firm—H. Daniel Schnurmann

(57) ABSTRACT

A method for identifying potentially defective integrated circuit chips and excluding them from future testing as wafers move through a manufacturing line The method includes data-collecting steps, tagging the chips on wafers identified as potentially bad chips based on information collected as the wafer moves down the fabrication line, evaluating test cost savings by eliminating any further tests on the tagged chips preferably using a test cost database. Considering all the future tests to be preformed, the tagged chips are skipped if it is determined that the test cost saving is significant. Tagging bad chips is based on various criteria and models which are dynamically adjusted by performing the wafer final test on samples of the tagged chips and feeding-back the final test results. The dynamic adaptive adjustment method preferably includes a feedback loop or iterative process to evaluate financial tradeoffs when assessing the profit of salvaging chips against the additional test costs.

13 Claims, 4 Drawing Sheets

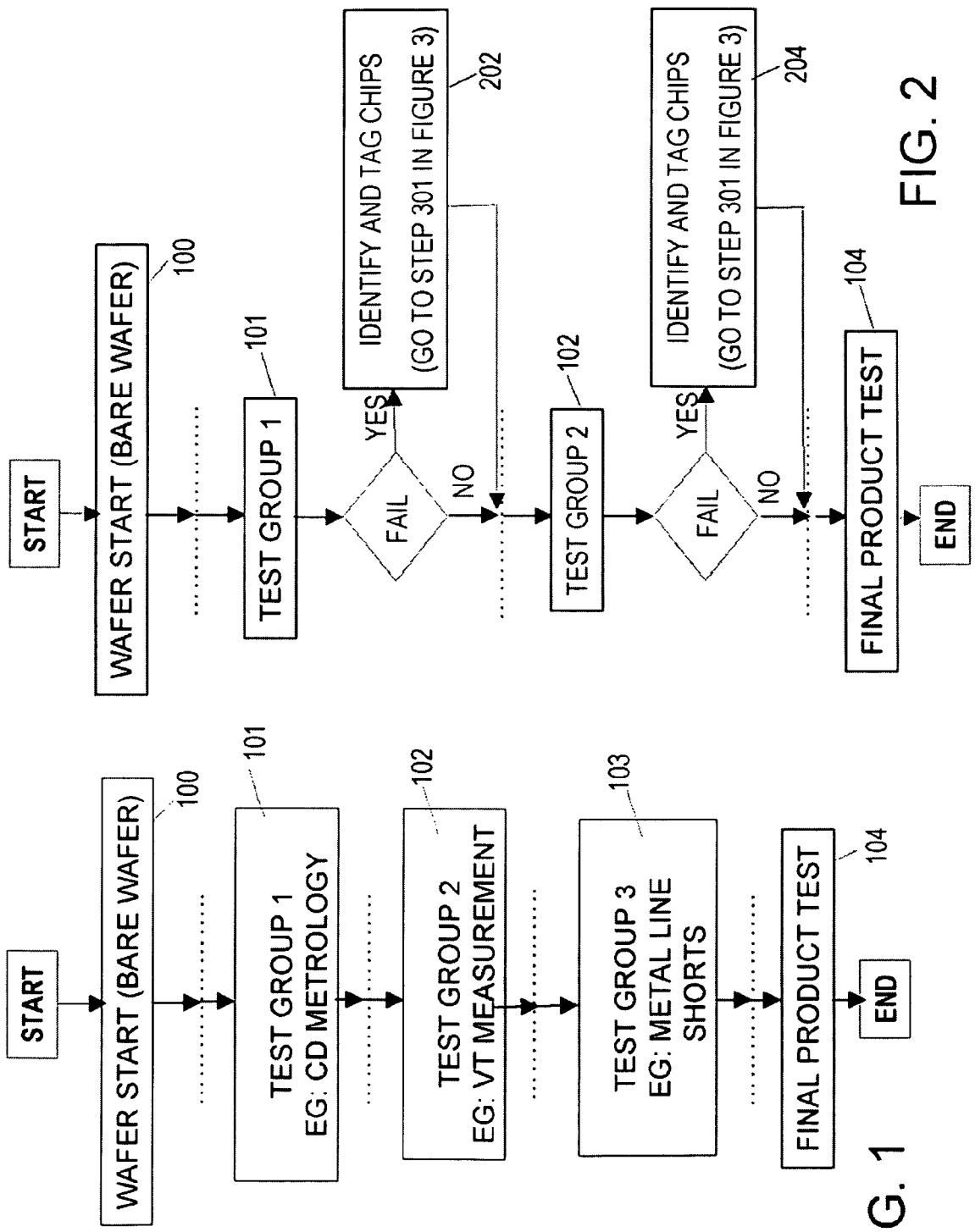

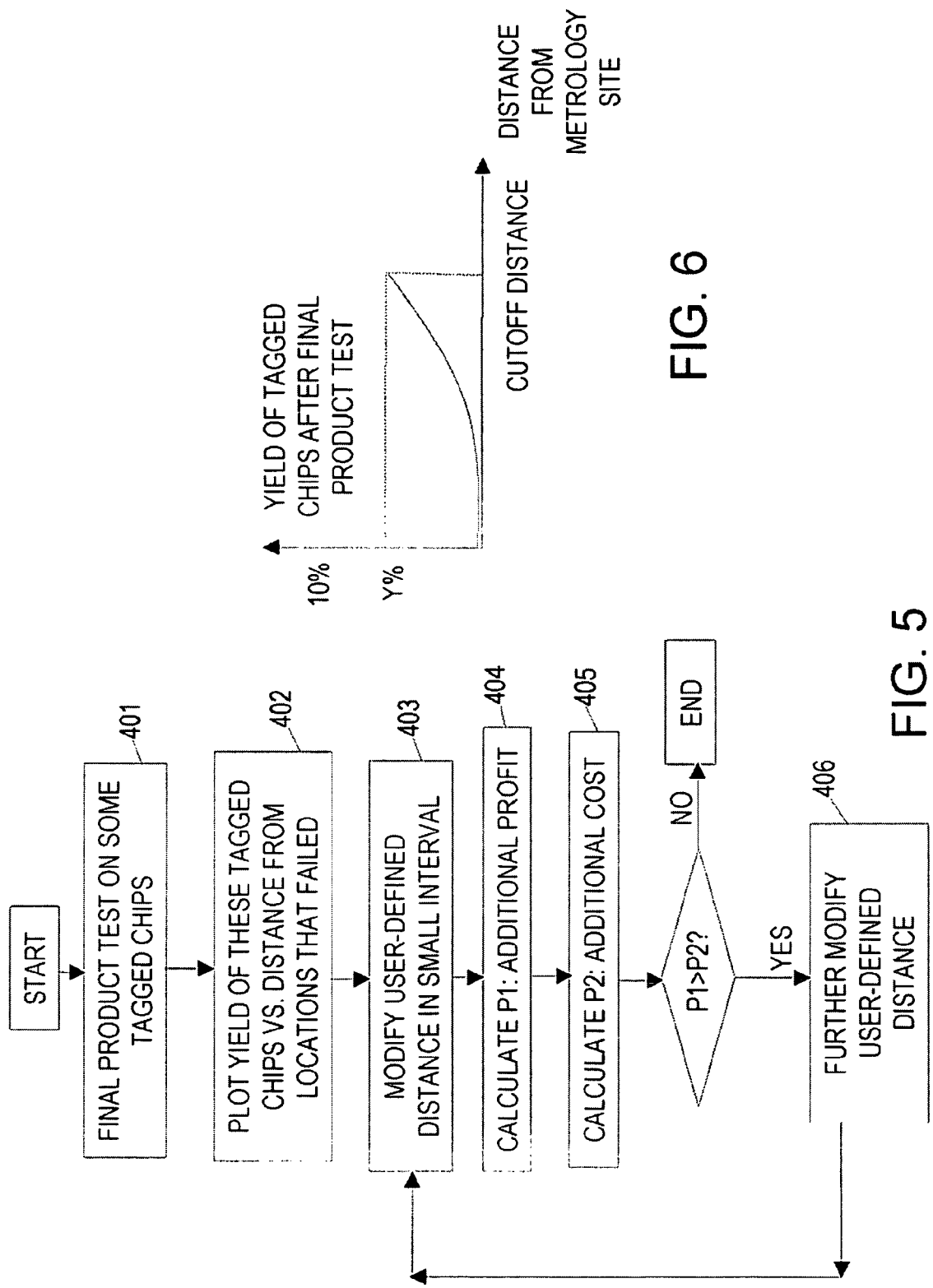

METHOD OF ADAPTIVELY SELECTING CHIPS FOR REDUCING IN-LINE TESTING IN A SEMICONDUCTOR MANUFACTURING LINE

FIELD OF THE INVENTION

The present invention generally relates to semiconductor circuit testing, and more particularly to a method and system for in-line testing semiconductor wafers.

BACKGROUND OF THE INVENTION

In a semiconductor fabrication line, wafers and chips will inevitably be misprocessed or affected by defects as they move along hundreds of process steps. Many in-line tests are conducted and measurements taken, including defect inspection, metrology, parametric, and functional tests that monitor the health of wafers as they move down the fabrication line. Based on the results of these in-line tests/measurements, decisions may be made as to whether to dispose of potentially bad wafers. When wafers are found to be 'really' defective, i.e., having a high concentration of bad chips, these wafers will be discarded early in the process flow.

When a wafer is not disposed of based on existing wafer disposition criteria because, for example, there still remains a significant number of good chips on the wafer, some chips on the wafer may nonetheless be identified as bad chips through in-line testing. In other words, those wafers may have a mixture of potentially good and known bad chips and, therefore, may not be disposed of due to cost and/or economic considerations. However, chips that are known to be bad may continue to be subjected to subsequent in-line tests alongside with other good chips on the wafer. This presents several disadvantages: firstly, redundant testing of known bad chips wastes valuable testing time and resources. Secondly, the data collected on the bad chips confounds future data and yield analysis. Thirdly, by not disposing of the bad chips early in the fabrication process, there is a potential for the chips to escape wafer final test, causing a decreased shipped product quality level (SPQL).

The concept of adaptive testing has been known in the art as, for instance, in the article "Adaptive test adds value to wafer probe" authored by B. Bischoff et al. and published in Semiconductor International Magazine (August 2004) that provides a review of this area. Nevertheless, this article merely points to a general direction but fails short in providing any specific method to select which die to test or not to test. Generally, due to the high cost associated with in-line testing, only a very small portion of the chips on a wafer or in a lot are typically tested (approximately, 5% to 15% of all the chips). Therefore, without any specific instructions, it is not evident how chips are to be selected when most of the chips are not tested. Moreover, for the small portion of the chips that are tested, it is not clear how good chips may be separated from the bad chips unless criteria for judging good and bad are clearly established that correlates well with results obtained when performing wafer final testing.

U.S. Patent Application Publication No. 2004/0236531A1, titled "Method for Adaptively Testing Circuits Based on Parametric Fabrication Data" describes a method for adaptively changing the test content based on the results of in-line tests and in-line defect inspection. In this patent application, in-line testing or defect inspection is used to estimate process capability that determines whether the wafers/lots are healthy or poor. Based on the estimated process capability, the test program is modified, retaining only the parametric and functional tests needed for performance verification.

U.S. Patent Application Publication No. 2004/0181717A1 titled "Adaptive Defect Based Testing", describes an adaptive testing method wherein the results of testing at a preceding stage are used to modulate the level of testing at a following stage. After each stage, a tested chip is partitioned into several bins, based in part on the logical structure of the integrated structure, and a defectivity value is assigned to each bin. Based on the assumption that bins having lower defectivity values contain relatively healthy chips, these chips are tested with a modified test—one having a lower level of testing, that is, with some tests being skipped. Conversely, bins tagged having higher defectivity values are tested with the full suite, or higher level (cycle) of testing.

Referring now to FIG. 1, a simplified flow chart is illustrated showing commonly practiced tests and measurements. For illustrative purposes, three test groups 1, 2, and 3 are depicted, each consisting of a group of tests and measurements typical of selected levels of in-line testing, (i.e., when the wafers are still in a clean room or early fabrication stages between process steps). A person skilled in the art will appreciate that additional steps may exist between steps illustrated in FIG. 1. Step 100 refers to a first step where wafers are brought into a clean room environment for processing. Step 101 is a test group labeled test group 1 representing a first test cycle. An example of such test group is CD (critical dimension) metrology for polysilicon gate, where the line width of polysilicon lines in a number of selected locations across the wafer is measured. Step 102 is another test group labeled test group 2, representing another test cycle. An example of such test group is transistor threshold voltage measurement, where the threshold voltage of a number of selected transistors across the wafer is measured. Step 103 is a test group labeled test group 3 representing a third test cycle. An example of such test group is the measurement of some specifically designed yield monitoring test structures across the wafer, for example, test structures monitoring metal-line-to-metal-line shorts. Other examples of test groups not listed may include optical and electron-beam-based inspection of circuit patterns to detect defects or systematic patterning failures as well as other various tests and measurements of other integrated circuits characteristics. Step 104 is the final step of the wafer in the fabrication flow. In this step, referenced as final product test, the product circuits on the wafer are tested. Typically, hundreds of process steps may exist between the first step 100, and the final step 104 in any semiconductor fabrication process flow.

OBJECTS AND SUMMARY OF EMBODIMENTS OF THE INVENTION

Accordingly, it is an object of the present invention to provide a system and a method for identifying defective chips early in a manufacturing process, bypassing testing potentially bad chips identified by their respective history of failing certain tests, and allowing only good chips to be further tested.

It is another object to limit further testing and measurements by taking into consideration the test history of, e.g., in-line tests and measurements during defect inspection (PLY), metrology, parametric, functional tests, wherein the health of a wafer is monitored as it move down a fabrication line.

It is still another object to reduce the testing time allocated to a wafer by disposing of the wafers or chips that inevitably are misprocessed or affected by defects as they move down a fabrication line.

It is a further object to provide a system and method that targets potentially bad chips that are excluded from further testing, and that selectively alters the test-map of the wafer in accordance to some predetermined criteria rather than altering the test content.

These and other objects, aspects and advantages of the invention are provided by a method and system for identifying defective chips. The bad chips are selected during the wafer process flow and then tagged. The selection process is performed simultaneously as the wafers move along the fabrication line, and therefore does not reduce wafer fabrication cycle time. Because the tagged chips will not be tested further during any future in-line tests, costly additional test time is eliminated. The exact selection criteria at each in-line test/measurement level is determined and periodically modified by a feedback position adjusting model implemented at wafer final test. Alternatively, the test programs for disposing of the defective chips are based on yield models which may be subject to adaptive modifications.

By reducing the test time for each wafer under test, the test throughput is greatly improved as well as the data validity achieved by not testing bad chips. Furthermore, it adaptively changes test program to dispose of bad chips based on yield models. By testing the defective chips during final wafer test (but not in-line), some of the chips may be recovered, and the results used to adaptively modify the test disposition criteria to optimize the process of tagging and disposing of the bad wafers. As such, the wafer-level disposition criteria is instrumental for recovering 'marginally' tagged chips.

In another aspect of the invention, there is provided a method and a computer program that selects and tags potentially bad chips and exclude them from future tests while wafers are moving in the manufacturing line, wherein the method consists of data-collecting steps, tagging the chips on wafers as potentially bad chips based on information collected as wafer moves along fabrication line; and evaluating test cost savings by eliminating further testing on the tagged chips, preferably using a test cost database. When subsequent tests are performed, the tagged chips are skipped, which significantly reduces testing costs.

Tagging bad chips is based on a set of "bad chip" criteria or models, which are dynamically adjusted by performing a wafer final test on all the chips, including the tagged chips and feeding-back the final test results. The dynamic adjustment method preferably includes a feedback loop for evaluating the financial tradeoff by assessing the profit of salvaging chips against the additional test cost to determine if the criteria used are found to be optimum. Furthermore, the tagging is performed along with the wafer moving through the semiconductor fabrication line.

In still another aspect of the invention there is provided a method of testing integrated circuit (IC) wafers, each of the wafers having a plurality of chips, the method including: a) determining a cost associated with performing levels of testing in a fabrication cycle of the IC wafer; b) performing a first test on the chips forming the IC wafer and producing first test results associated with a first characteristic of the chips forming the IC wafer; c) tagging the chips failing to produce acceptable first test results; d) eliminating from any further testing the tagged chips using the cost associated with the corresponding level of testing; e) moving to a subsequent level of testing associated with other characteristics of the chips forming the IC wafer; and f) repeating step b) through e) and comparing the saving versus the cost associated with performing the added testing.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

FIG. 1 is a simplified flow chart illustrating test groups of conventional in-line tests and measurements;

FIG. 2 is a demonstrative flow chart illustrating the method of testing IC wafers that selects and tags potential bad chips, excluding them from future testing as the IC wafers move through the manufacturing line, according to one embodiment of the present invention;

FIG. 5 is a demonstrative flow chart that illustrates the feedback adjustment process used to determine the optimal distance used to select and tag the chips; and FIG. 6 is sample graph that plots yield versus distance obtained from testing a portion of the tagged chips at wafer final test.

DETAILED DESCRIPTION OF PREFERRED EMBODIMENTS

Distinctive features and elements of the present invention will become more apparent through the following description of preferred embodiments, which are given for illustration of the invention and are not intended to be limiting thereof.

Referring to FIG. 2, there is shown a flow chart of an embodiment of the present invention. The steps 100, 101, 102 and 104 are the same corresponding steps described with reference to FIG. 1.

Steps 202 and 204 illustrate additional steps taking place when a test detects one or more failings during measurement. In these steps, chips are identified and tagged for possible exclusion of future tests. The detailed operations following steps 202 and 204 are explained with reference to the flow chart shown in FIG. 3. Following the stated operations, the wafer continues to the next process step.

Figure 3:
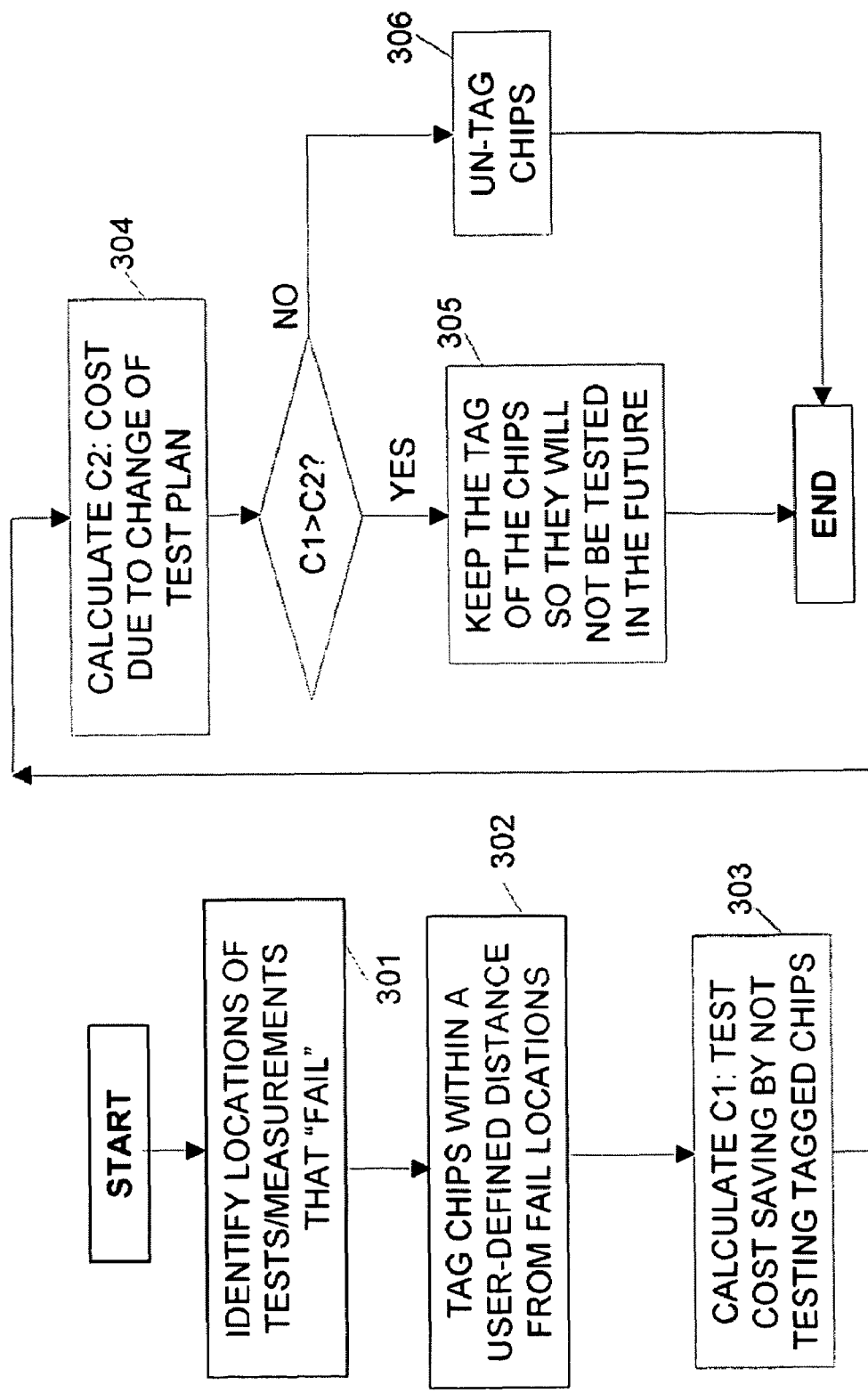
FIG. 3 is a demonstrative flow chart illustrating method of determining an adaptive chip sampling cost saving following tagging potential bad chips, as illustrated in FIG. 2.

Referring now to FIG. 3, in step 301, the locations of chips failing tests and/or measurements are first identified in the wafer. In step 302, chips located within a user defined distance from the failing locations are tagged. (Note: tagging refers to identifying chips labeled by computer software, by an operator or user manually for future use). The user defined distance ranges preferably from 20 mm to 60 mm. The defined distance provides an initial value to start with and may be adjusted by successive adaptive adjustments, as discussed hereinafter in more details. Just as the effect of initial value used in most other mathematical models, a relatively correct (or close to correct) starting value may help the model converge quickly and reduce any initial set up cost. Such tagging methodology is based on the understanding that most parametric variations have a spatial correlation distance. If one site is determined to be out of the specification, it is likely that the same parameter will also be out of the specification within a certain distance, causing chips within that distance not to function. However, it is also understood that not all parametric variations are spatially correlated, and it will be shown that such cases will be automatically addressed by the adaptive adjustment model discussed hereinafter, and the distance will be automatically shrunk to zero for parameters devoid of spatial correlation.

In step 303, after tagging the chips, a "test cost saving C1" is calculated. In step 304, the cost associated with changing the test plan C2, to exclude the tagged chips from future tests is calculated. Details of determination of savings and costs are shown hereinafter with reference to FIG. 4. The cost savings C1 and C2 are then compared. If C1>C2, step 305 is performed allowing the process of chips tagging to continue. If C1<C2, step 306 will be performed where the chips tags are removed (i.e., the chips are 'untagged').

Figure 4:
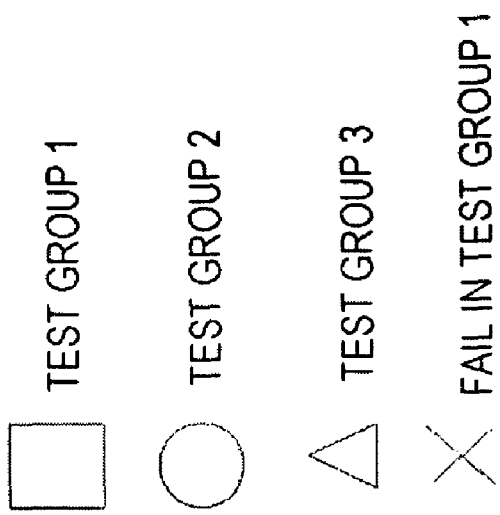
FIG. 4 is an example that illustrates a test map of three test groups to highlight the concept of tagging chips within a user-specified distance and calculation of the costs, according to another embodiment of the invention.

FIG. 4 illustrates tagging chips within a user-specified distance and calculating the costs. For illustrative purposes, FIG. 4 depicts a portion of a wafer having a matrix of 5×5 or 25 chips. Each chip is labeled by a number ranging from 1 to 25. Because of the test cost, typically only subsets of the chips are tested. Within each chip, a square indicates that the chip is in the original test plan of test group 1 and will be tested in test group 1. A circle is indicative that the chip is in the original test plan of test group 2 and will be tested in test group 2. Finally, a triangle signifies that the chip is in the original test plan of test group 3 and will be tested in test group 3. Assuming that in test group 1, one chip, e.g., chip 13, fails out of the 3 chips tested. Then, based on the tagging criteria discussed previously, all 9 chips within the circle 501, i.e., chips 7-9, 12-14, and 17-19 will be tagged as potential candidate chips for future test exclusion. Therefore, chips 9 and 18 are to be excluded from test group 2, and chip 13 from test group 3.

The previous example will now be shown to illustrate how to calculate the test cost savings. Assuming test groups 2 and 3 to be the only remaining tests. The test cost savings is preferably calculated as follows: assuming that each tagged chip is not intended to be subject to any future in-line tests. Then, the test cost saving is the test cost per chip multiplied by the number of tagged chips that were originally planned to be tested. This calculation will be performed for all the remaining tests and the sum calculated. The remaining tests include in-line testing as well as final product testing, i.e., functional test. In the example illustrated in FIG. 4, there are two remaining test groups left when the chips are tagged. Assuming that test group 2 costs $A/wafer and that test group 2, n2=4 chips. Assuming further that on the wafer to be tested, test group 3 costs $B/wafer and that in test group 3, n3=3 chips on the wafer are to be tested. Out of the tagged chips, m2=2 chips fall into the test plan for test group 2 and are originally planned to be tested in test group 2, while m3=1 chips fall into the test plan for test group 3 and are originally planned to be tested in test group 3. Thus, the test cost saving is determined by $$A/n2\times m2+\$B/n3\times m3=\$A/4\times 2+\$B/3\times 1.$$

The cost due to change of the test plan will now be calculated. This cost can be mainly attributed to engineering costs. Once again, using the previous example, it is assumed that only two test groups remain.

The engineering time needed to change test plan for test group 2 but excluding the tagged chips from being tested is t2. The engineering time needed to change the test plan for test group 3 excluding the tagged chips from testing is t3. Given that the cost of engineering time is $C, then the cost due to change of test plan is $C×(t2+t3). By comparing the cost associated with change of test plan C2 and the test cost saving being C1, it can be decided whether it is financially advisable to exclude the tagged chips from future testing. If C1>C2, the chips will remain tagged and will not receive future tests; if C1<C2, the chips will be untagged. Because of the high cost of typical in-line tests, it is expected that C1>C2 most of the time, therefore significant test cost saving can be achieved. Following this operation, the wafer is sent to the next wafer processing step.

FIG. 5 is a flow chart illustrating the adaptive adjustment model, also referred hereinafter as training model. At the end of the process flow, i.e., when the wafers have completed all the process steps, the regular procedure as explained in the previous paragraphs will skip final product test on the tagged chips, while in prior art typically every chip will be subjected to final product testing. This, by itself, results in a significant test cost saving due to the high cost associated with final test.

In order to periodically invoke the training model, in step 401, all or part of the tagged chips can be chosen to receive final product test for training model purpose. Then, in step 402, the yield of final product test vs. the distance from the failing location when the chip was first tagged in-line, is plotted.

FIG. 6 shows an example of a plot of yield of final product test versus distance from failing location. If there is a spatial correlation for this metrology measurement, yield should increase with distance, because the farther away from the site that is out-of-specification, the higher the yield. In step 403, the cut-off distance for tagging the chips is changed or reduced, and a number of chips N that were originally tagged become now no longer tagged. Therefore, out of the N chips, N×Y chips are good chips, meaning chips that may be sold to customers, at final product test, where Y denotes the yield corresponding to the cutoff distance. This additional profit P1 from the N chips is therefore N×Y×profit/chip, where profit/chip is extracted from a financial database, in view of the profit each chip that is to be made depends on market data, e.g., by supply and demand. Therefore, in step 404, the additional profit P1 is calculated. On the other hand, by not tagging the N chips at the original metrology step, the N chips would be tested at all the in-line test steps past the metrology step, and additional test cost will be incurred. The additional test cost P2 is given by N1×test1 cost/chip+N2×test2 cost/chip+N3×test3 cost/chip+ . . . , where test 1, 2, 3, . . . are the in-line tests following metrology step in the test flow, and N1, N2, N3, . . . are the number of tagged chips falling within the test plans of test 1, 2, 3. Consequently, in step 405, the additional cost P2 is calculated. If the additional profit subtracted by the additional test cost is a positive number (P1>P2), then the algorithm branches to step 406 where the cut-off distance is further modified.

In steps 403-406, the above process is represented by an iterative process of modifying the criteria in small intervals until an acceptable distance is identified. When certain conditions are met such as, for example, when the financial benefit (P1−P2)<0, the process may stop the iterative process, which is an indication that the user-defined distance has now become acceptable, and/or under certain circumstances been optimized.

The present invention can be realized in hardware, software, or a combination of hardware and software. The present invention can be realized in a system of single computer of centralized fashion or in a system of several interconnected computers in a distributed fashion. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

It is noted that the foregoing has outlined some of the more pertinent objects and embodiments of the present invention. The present invention may be used for many applications. Thus, although the description is made for particular arrangements and methods, the intent and concept of the invention is suitable and applicable to other arrangements and applications. It will be evident to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

While the present invention has been particularly described in conjunction with a spec and a preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for testing integrated circuit (IC) wafers, each of the IC wafers including a plurality of chips, the method comprising:
    a) performing a first test on a subset of said chips at a first level of testing in a fabrication cycle of the IC wafers and producing first test results of a first characteristic of the IC wafers;
    b) recording the first test results with associated identification information using the associated identification information to tag chips failing to produce the first test results;
    c) based on the identification information related to the tagged chips, determining a test cost saving and establishing a level at which the test cost saving meets predetermined criteria; and
    d) when the test cost saving meets the predetermined criteria, the tagged chips are excluded from further testing as the IC wafers move to a second level of testing associated with a second characteristic of the IC wafers.

2. The method in accordance with claim 1, wherein said identification information includes information related to chip location.

3. The method in accordance with claim 1 further comprising generating criteria or models for determining a potentially defective chip, said criteria or models being used for tagging potentially defective chips.

4. The method in accordance with claim 1, wherein said recording of test results associated with said first and second tests comprises feeding back results obtained from performing subsequent levels of testing associated with other characteristics of the IC wafers.

5. The method in accordance with claim 3, wherein said tagging includes tagging untested chips of said IC wafer which are predicted to fail by said models or criteria.

6. The method in accordance with claim 1, wherein said first and second levels of testing include a plurality of in-line testing and measurements.

7. The method in accordance with claim 5, wherein determining said tagging of potential defective chips comprises periodic adjustments of said models and criteria.

8. The method in accordance with claim 1, wherein said first and second levels of testing are selected from a group consisting of defect inspection, metrology, electrical parametric tests, device tests, and functional tests.

9. The method in accordance with claim 1, wherein said tagging is performed with the IC wafers moving through the semiconductor fabrication line.

10. The method in accordance with claim 7 further comprises adaptively altering test programs used to dispose of the defective chips based on yield models.

11. The method in accordance with claim 1 further comprising testing defective chips during final wafer test to recover marginally tagged chips.

12. The method in accordance with claim 11, further comprising creating modified and improved chip level disposition criteria related to recovering the marginally tagged chips.

13. A program storage device readable by a machine, tangibly embodying a program of instructions executable by the machine to perform method steps for testing integrated circuit (IC) wafers, each of the IC wafers including a plurality of chips, the method steps comprising:
    a) performing a first test on a subset of said chips at a first level of testing in a fabrication cycle of the IC wafers and producing first test results of a first characteristic of the IC wafers;
    b) recording the first test results with associated identification information; using the associated identification information to tag chips failing to produce the first test results;
    c) based on the identification information related to the tagged chips, determining a test cost saving and establishing a level at which the test cost saving meets a predetermined criteria; and
    d) when the test cost meets the predetermined criteria, the tagged chips are excluded from further testing as the IC wafers move to a second level of testing associated with a second characteristic of the IC wafer.

* * * * *